United States Patent
Serra et al.

(10) Patent No.: US 8,972,212 B2
(45) Date of Patent: Mar. 3, 2015

(54) INSTRUMENT AND METHOD FOR MEASURING THE LOSS FACTOR OF AN ELECTRICAL APPARATUS

(75) Inventors: Stefano Serra, San Vittore Olona (IT); Gian Carlo Montanari, Zola Predosa (IT)

(73) Assignee: Techimp HQ S.R.L., Zola Predosa (IT)

( * ) Notice: Subject to any disclaimer, the term of this patent is extended or adjusted under 35 U.S.C. 154(b) by 527 days.

(21) Appl. No.: 13/504,856

(22) PCT Filed: Oct. 27, 2010

(86) PCT No.: PCT/IB2010/054860
§ 371 (c)(1),
(2), (4) Date: Apr. 27, 2012

(87) PCT Pub. No.: WO2011/051890
PCT Pub. Date: May 5, 2011

(65) Prior Publication Data
US 2012/0215469 A1    Aug. 23, 2012

(30) Foreign Application Priority Data
Oct. 28, 2009    (IT) .............................. BO2009A0699

(51) Int. Cl.
*G06F 11/00* (2006.01)
*G01R 27/26* (2006.01)
*G01R 31/02* (2006.01)

(52) U.S. Cl.
CPC .......... *G01R 27/2694* (2013.01); *G01R 31/021* (2013.01); *G01R 31/025* (2013.01)
USPC ......................................................... 702/61

(58) Field of Classification Search
CPC ................ B60R 2021/0004; B60R 2021/0006
USPC ...................................... 702/61, 64, 182–185
See application file for complete search history.

(56) References Cited

U.S. PATENT DOCUMENTS

| | | |
|---|---|---|
| 2005/0156587 A1 | 7/2005 | Yakymyshyn et al. |
| 2005/0212524 A1 | 9/2005 | Ennis et al. |
| 2006/0181284 A1 | 8/2006 | Fraedrich |
| 2007/0057662 A1 | 3/2007 | Yakymyshyn et al. |
| 2007/0063691 A1 | 3/2007 | Yakymyshyn et al. |
| 2007/0205749 A1 | 9/2007 | Yakymyshyn et al. |
| 2007/0205750 A1 | 9/2007 | Yakymyshyn et al. |
| 2008/0048668 A1 | 2/2008 | Mashikian |
| 2014/0113828 A1 * | 4/2014 | Gilbert et al. ................. 505/100 |

FOREIGN PATENT DOCUMENTS

| | | |
|---|---|---|
| CA | 2 368 901 A1 | 10/2000 |
| CH | 659 138 A5 | 12/1986 |
| CN | 101529259 A | 9/2009 |

(Continued)

*Primary Examiner* — Edward Raymond
(74) *Attorney, Agent, or Firm* — Pearne & Gordon LLP

(57) ABSTRACT

An instrument (1) for measuring the loss factor of an electrical apparatus (2) having an axially extending elongate geometry, in particular a medium voltage cable, comprises: at least a first and a second sensor (3A, 3B) connectable to the apparatus (2) in a first and a second measuring section (4A, 4B) axially spaced along the apparatus (2) by a predetermined quantity, respectively, and designed to measure respective values of the magnetic field generated outside the apparatus (2) by a load current flowing axially through the apparatus; a processing unit (5) designed to receive the magnetic field values measured by the sensors (3A, 3B) and programmed to derive from them a load loss value as a function of the difference between the measured magnetic field values.

15 Claims, 3 Drawing Sheets

(56) References Cited

FOREIGN PATENT DOCUMENTS

| DE | 626 299 C | 2/1936 |
|---|---|---|
| DE | 199 14 772 A1 | 10/2000 |
| EP | 0942291 A2 | 9/1999 |
| EP | 1 154 277 A1 | 11/2001 |
| EP | 1 892 534 A1 | 2/2008 |
| WO | 2007/068221 A1 | 6/2007 |

* cited by examiner

INSTRUMENT AND METHOD FOR MEASURING THE LOSS FACTOR OF AN ELECTRICAL APPARATUS

TECHNICAL FIELD

This invention relates to an instrument and a method for measuring the loss factor of an electrical apparatus having an axially extending elongate geometry.

More specifically, the invention relates to an instrument and a method for measuring the loss factor in an electric cable, especially in an electrical cable.

BACKGROUND ART

The loss factor—also known as loss angle or tan delta—is a measure of the deviation of the electric behaviour of a real capacitor with respect to that of a perfect system.

In effect, the current flowing through a perfect capacitor with an alternating voltage applied to it (which can be represented in a plane by a vector) is in quadrature relative to the voltage, that is to say, it corresponds to a vector displaced at 90 degrees from the voltage vector.

In a real capacitor, on the other hand, comprising a dielectric material which is not perfect (and whose conductance is therefore not zero), the voltage and current are displaced at an angle of less than 90 degrees, and the difference between 90 degrees and the real displacement angle is an angle denoted by delta.

The loss factor (or tan delta) is the tangent of the angle delta.

As regards the techniques for measuring tan delta, in particular on electric cables, there are two known solutions.

A first solution involves detecting the leakage current, representing the conduction current flowing through the cable insulation, so as to estimate its displacement relative to the voltage applied to the cable (in practice, that means measuring impedance using bridge methods).

This technique has the disadvantage of being relatively unreliable and imprecise, since the leakage current normally has a very low intensity, thus posing a problem of sensitivity for the sensors used to detect it. Another disadvantage is that this technique cannot be used on apparatus which is in service, that is, live, but only on apparatus which is out of service (offline measurements).

A second solution involves detecting an electrical field in order to derive the conduction current that flows through the cable insulation.

This solution has two drawbacks.

First of all, it is not very reliable since the field measurement is influenced by noise outside the cable. Further, this technique is not applicable online, that is to say, when the cable is live.

It is also known patent document US2005/0212524, which describes an electric power line on-line diagnostic method for determining the present condition of a line.

The method comprises the step of measuring the phase angle difference between the load currents at the two ends of the line, i.e. at a first end and at a second end, respectively.

The phase angle difference is obtained by measuring directly the current at the first end and at the second end.

According to the teachings of US2005/0212524, the phase angle difference is related to the loss factor (or tan delta) according to an empiric relation defined by a graph.

However, the phase shift of the load current flowing in the cable, between the phase of the current at the two ends of the cable, is only indirectly and partially related to the value of loss factor (tan delta) in the cable.

Therefore, the teachings of US2005/0212524 do not allow to calculate accurately the value of loss factor (tan delta) in the cable, but, at most, provide a vague indication about said value.

Furthermore, from patent document WO2007/068221 it is known a device for measuring a current value flowing in an electric cable.

Said device comprises two magnetic sensors, one magnetically weakly coupled and the other strongly magnetically coupled with the cable, for measuring the magnetic field in a same section of the cable.

However, WO2007/068221 does not provide any teaching for measuring the loss factor.

Furthermore, from patent document EP 1 892 534 it is known a diagnostic system to facilitate identification and location of insulation defects along a power cable.

Said method comprises the step of: i) connecting an alternating voltage source and applying a voltage source to a cable at a sending end thereof, ii) applying a voltage to the cable at a first frequency to set up a travelling wave along the cable that is reflected at the receiving end thereof, iii) measuring the total complex power loss at the sending end of the cable, iv) measuring the standing wave voltage at any points/section of the cable based on the load impedance connected at the receiving ends of the cable, and on the characteristic impedance of the cable.

According to the method, in order to measure the dissipation factor (tan delta), the method comprises the step of varying many parameters (e.g. the load impedance, the frequency of the voltage source, etc.).

However, the above described method is quite complicated because it needs to connect a plurality of devices/apparatus (e.g. the variable frequency generator) to the ends of the power cable.

This invention has for an aim to provide an instrument and a method for measuring the loss factor of an electrical apparatus having an axially extending elongate geometry and which overcome the above mentioned disadvantages of the prior art.

More specifically, this invention has for an aim to provide an instrument and a method for measuring in a highly reliable and precise manner the loss factor of an electrical apparatus having an axially extending elongate geometry and which can also be used on apparatus which is in service.

A further aim of this invention is to provide an instrument and a method for measuring the loss factor of an electrical apparatus having an axially extending elongate geometry and applicable also to shielded electric cables (without having to remove the shield).

DISCLOSURE OF THE INVENTION

These aims are fully achieved by the instrument and method according to the invention as characterized in the appended claims.

More specifically, the instrument according to the invention comprises:

at least a first and a second sensor connectable to the apparatus in a first and a second measuring section axially spaced along the apparatus by a predetermined quantity, respectively, and designed to measure corresponding values of the magnetic field signals generated outside the apparatus by a load current flowing axially through the apparatus at said first and a second measuring sections, said values being representative of the amplitude of said magnetic field signals;

a processing unit designed to receive said magnetic field values measured by the sensors and programmed to derive from them a load loss value as a function of the difference between said measured magnetic field values, said difference being representative of the difference between the amplitude of said magnetic field signals at said measuring sections.

The method according to this invention comprises the following steps:

coupling at least a first and a second sensor to the apparatus in a first and a second measuring section axially spaced along the apparatus by a known quantity, respectively;

measuring, through the first and the second sensor, respectively, at least a first and a second value of the magnetic field signals generated outside the apparatus by a load current flowing axially through the apparatus at said first and second measuring section, said values being representative of the amplitude of said magnetic field signals;

deriving a loss factor value as a function of the difference between the first and the second measured magnetic field value, said difference being representative of the difference between the amplitude of said magnetic field signals at said first and second measuring section.

Thus, this invention makes it possible to calculate the loss factor with an excellent degree of precision and in a highly reliable manner, by measuring two magnetic field signals at two separate sections of the apparatus in order to then derive a signal given by the difference between the two signals, apply the Fourier transform to it and, as a function of the data obtained, directly calculate the value of the loss factor.

This technique of measuring tan delta advantageously allows integral processing of the electrical properties of the apparatus, extended to the entire portion between the two measuring sections. In effect, tan delta is defined as a quantity representing a property of the insulation as a whole and not a local property of a portion of the insulation.

The techniques currently in use, on the other hand, use local measurements of quantities relating to limited portions of the insulation. These techniques, therefore, are inherently uncertain because they are based on local measurements which are then assigned to the entire apparatus.

To obtain the required result, the Applicant conducted in-depth research and analysis which led to the development of a method for calculating the loss factor from a differential magnetic field measurement.

It should be noted that the magnetic field concerned is not the magnetic field associated with the leakage current but is the magnetic field generated by the load current that flows axially through the apparatus. Thus, the sensors used for the measurements are particularly effective because they do not give rise to any problems connected with their sensitivity.

Moreover, the invention comprises suitable means for making the magnetic field sensors immune from noise outside the apparatus.

These means involve the use of a plurality of sensors equally spaced around the apparatus in the measuring section). Further, the sensors are spaced from the apparatus in order to protect them from the risk of magnetic field peaks caused by possible current surges. Moreover, the sensors are enclosed in a shielding layer made from low-reluctance material. It should also be noted that the material the shielding layer is made of is preferably a soft material (whose hysteresis loop defines a very small area).

The invention also entails the use of an absolute time reference system for synchronizing the measurements of the sensors of the two measuring sections.

This makes it possible to obtain loss factor values which are comparable with the values obtained on any other apparatus, that is to say, having an absolute value.

BRIEF DESCRIPTION OF THE DRAWINGS

These and other features of the invention will become more apparent from the following description of a preferred, non-limiting embodiment of it, with reference to the accompanying drawings, in which.

DETAILED DESCRIPTION OF THE PREFERRED EMBODIMENTS OF THE INVENTION

Figure 1:
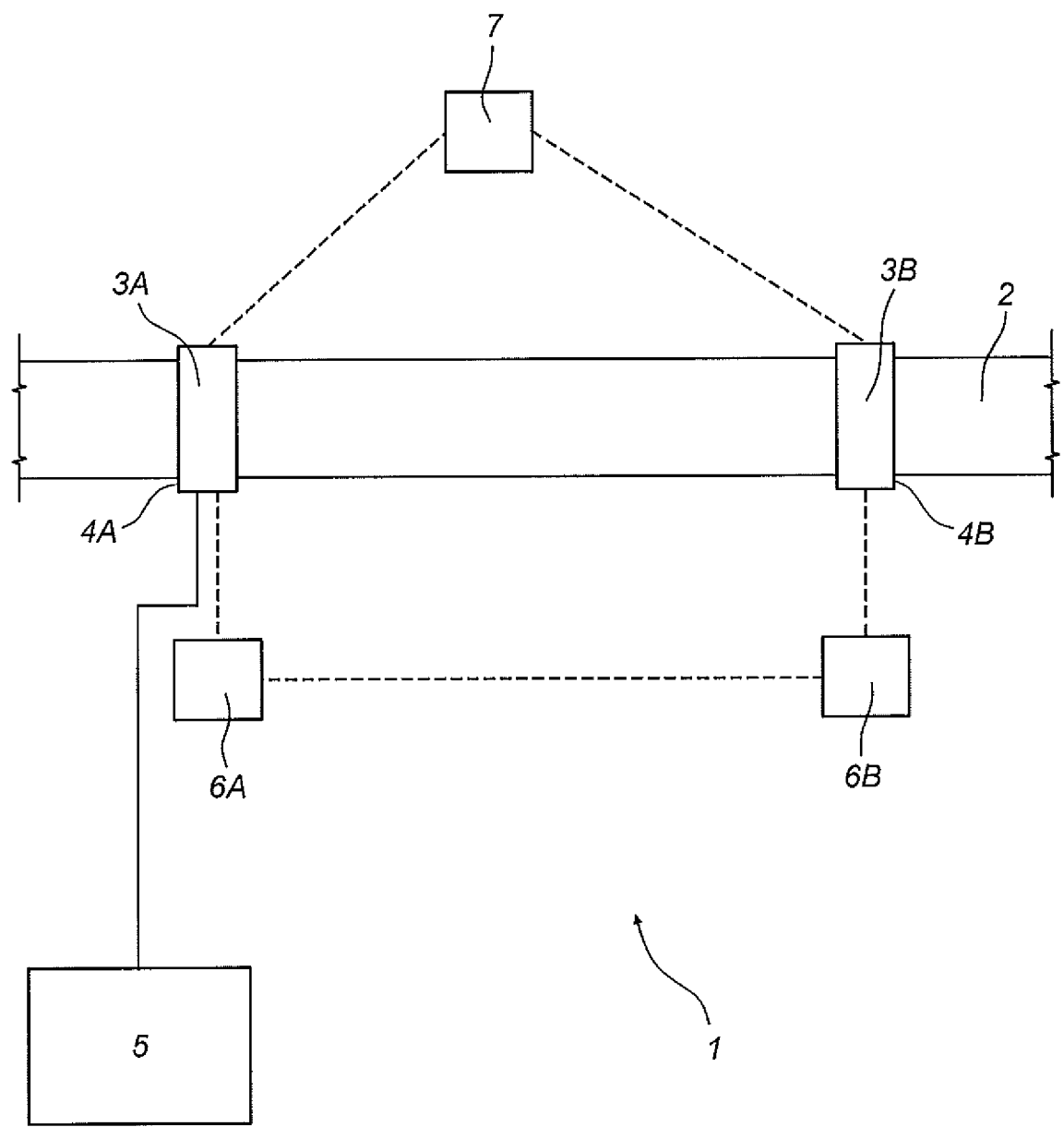
FIG. 1 schematically illustrates an instrument according to this invention.
Figure 2:
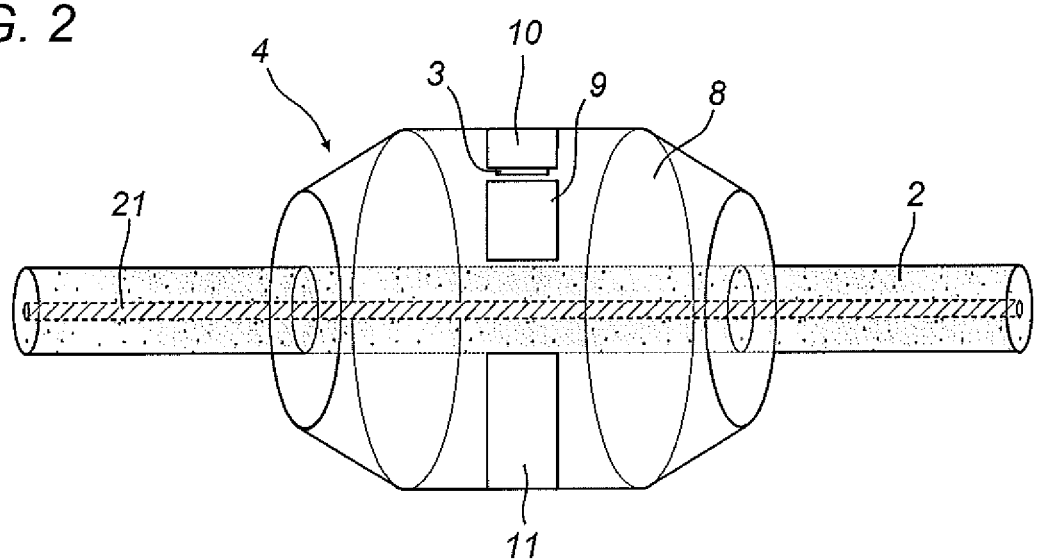
FIG. 2 illustrates in detail a portion of the instrument of FIG. 1 in a partly transparent side view.
Figure 3:
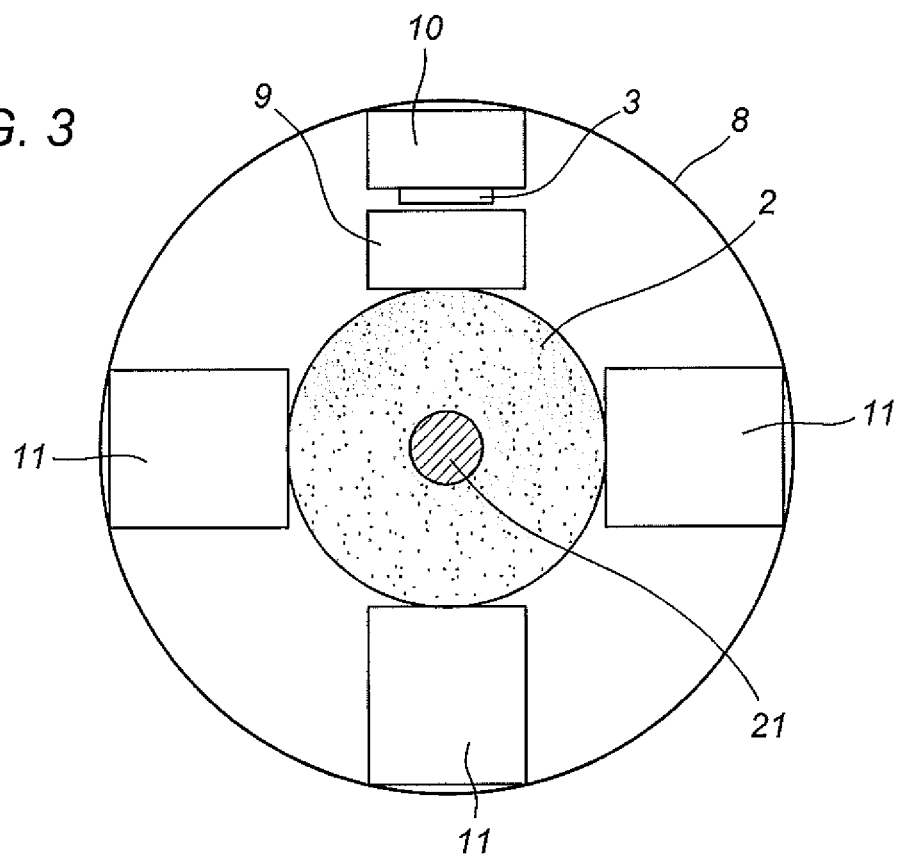
FIG. 3 shows the detail of FIG. 2 in a section view.

The numeral 1 in the drawings denotes an instrument for measuring the loss factor of an electrical apparatus 2 having an axially extending elongate geometry.

More specifically, the apparatus 2 is an electrical cable (for transmitting electrical power).

According to the invention, the instrument 1 comprises at least a first sensor 3A and a second sensor 3B connectable to the apparatus 2 in a first measuring section 4A and a second measuring section 4B, respectively.

The first and second measuring sections 4A and 4B are axially spaced along the apparatus 2 by a predetermined quantity (the quantity may be any quantity but it must be known; in other words, the sensors may be positioned at any distance from each other provided the distance is known).

The first and the second sensor 3A and 3B are configured to measure respective values of the magnetic field generated outside the apparatus 2 by a load current flowing axially through the apparatus 2.

It should be noted that load current means any current flowing through a lead 21 inside the insulation of the apparatus 2 for transmitting electrical power.

The sensors are preferably magnetic/resistive sensors (of per se known type). Alternatively, Hall probes or other known sensors may be used, provided they have a high sensitivity.

The instrument 1 further comprises a processing unit 5 designed to receive the magnetic field values measured by the sensors 3A and 3B and programmed to derive from them a value of the loss factor (that is, of tan delta, also denoted tanδ) as a function of the difference between the measured magnetic field values.

The processing unit 5 comprises, for example, a software-driven oscilloscope connected to a processor or, more simply, an acquisition card (of per se known type) and connected to a programmable processor (also of per se known type).

It should be noted that, according to the invention, each of the sensors 3A and 3B measures a signal representing the value of the tangential magnetic field, that is, generated by the load current flowing axially through the apparatus 2.

The processing unit 5 is configured to perform a sampling of the signals for generating a digital representation of the signals.

Further, these magnetic field signals measured by the sensors are transformed into a Fourier series in order to obtain a representation of them in the frequency domain.

Preferably, the processing unit 5 is programmed to derive the tan δ value of the loss factor as a function of the difference between the measured magnetic field values, according to equation 1 below.

$$\frac{R}{d} \cdot \frac{Re(H_\tau(z_2, \omega) - H_\tau(z_1, \omega))}{\frac{\omega \cdot E}{c \cdot 2 \cdot \sqrt{2\pi}} \cdot \varepsilon_0 \cdot (z_2 - z_1)} = \frac{1}{(z_2 - z_1)} \cdot \int_{z_1}^{z_2} \tan\delta(z) dz \quad (1)$$

In equation 1 set out above, z is a variable representing position along the apparatus 2, R is the distance (measured radially) of the sensors 3 from the centre of the apparatus 2 (that is, from the axis of the apparatus 2), d is the diameter of the apparatus 2 (if its geometry is cylindrical, or in any case, it is a quantity representing the size of the apparatus 2), $H_\tau$ is the tangential component of the magnetic field, $z_1$ and $z_2$ are the positions of the first and the second sensor, respectively, ω is the pulsation of the voltage applied to the apparatus, E is the electrical field to which the insulation of the apparatus 2 is subjected, c is the speed of light, and Re is the real part of the quantity that follows in brackets.

The equation 1 set out above, developed by the Applicant after in-depth studies on the subject, directly correlates the Fourier transform of a magnetic field variation along the apparatus 2 with an averaged value of tan delta.

This is particularly advantageous and in keeping with real requirements since tan delta is per se an average integral quantity.

In light of this, it should be noted that this approach advantageously makes it possible to apply only two sensors 3 to the apparatus 2, the sensors producing the effect of a sensor covering the entire stretch of apparatus 2 between the sensors 3, thanks to the fact that the processing unit 5 is programmed to derive the tan delta value through "integral" processing of the difference between the values measured by the sensors.

It is important to observe that the magnetic field values to be detected must be representative of the amplitude of the magnetic field.

This means that, if the magnetic field varies with a sinusoidal law (this is the most common situation), said values may be for instance the effective value of the magnetic field signal, or the peak values.

It should be observed that the transformation of the magnetic field signals into a Fourier series (in order to obtain a representation of them in the frequency domain) is not essential for the invention; in fact, the Fourier series of the magnetic filed are a preferred way to carry out the invention.

In this light, according to other embodiments, the processing unit 5 is not configured to transform the magnetic field signals into a Fourier series.

Hence, the processing unit 5 is configured to derive effective values of the magnetic signals at the first 4A and second 4B section.

Therefore, the processing unit 5 is programmed to calculate the load loss value (tan delta) from the effective values (or any other value equivalent thereto, such as the peak value) of the magnetic signals at the first 4A and second 4B section.

Preferably, synchronization means are provided, for synchronizing the two sensors 3A and 3B, i.e. for synchronizing the detection of the magnetic field values at the two measuring sections.

In this case, it is also possible to detect instantaneous amplitude values of the magnetic fields (in fact, such a synchronization makes not essential the detection, or the calculation, of effective values or the like).

In the latter situation, the values of the magnetic field are acquired from the first 3A and second sensor 3B at the same time (that is, the measured value are synchronized in such a way as to assign to each measured magnetic field value a respective measuring instant correlated to an absolute time reference).

It is observed that, from the formula (1) it is possible to derive another simplified formula, reported in the following as formula (100).

Also said formula can be used for the calculation of the tan δ value, form the measured magnetic field values.

In particular, preferably, the processing unit 5 is programmed to derive the tan δ value of the loss factor according to equation 100 below.

$$\tan\delta = \frac{I_1 \cdot \cos(\varphi) - I_2}{I_1 \cdot \sin(\varphi)} \quad (100)$$

In equation 100 set out above, $I_1$ is the value of the current at the first section 4A (or load current), $I_2$ is the value of the current at the second section 4B, cos φ is the power factor (the power factor of an AC electric power system is defined as the ratio of the real power flowing to the load to the apparent power and is a dimensionless number between 0 and 1), φ is the phase, or angle, between the current flowing in the cable and the voltage applied to the cable.

The values $I_1$ and $I_2$, preferably (and necessarily if the cable in operation, i.e. is energized), are not measured directly; in fact, the instrument 1 is configured to measure the magnetic field at the first section 4A (correlated to the current $I_1$) and the magnetic field (correlated to the current $I_2$) at the second section 4B.

The equation (100) is derived directly from equation (1) (applying known maths rules); in this light, advantageously, it should be noted that equation (100) is quite simple.

The instrument 1 also comprises a first data reception and transmission module 6A and a second data reception and transmission module 6B, consisting for example of radio or GSM modules (of per se known type) or other transmission lines (including existing ones, if any).

The first data reception and transmission module 6A is connected to the first sensor 3A for receiving the data measured by the latter, while the second data reception and transmission module 6B is connected to the second sensor 3B for receiving the data measured by the latter.

Also, the two data reception and transmission modules 6A and 6B are configured to transmit data to each other.

This advantageously allows the measurements performed by the two sensors 3 to be synchronized.

Thus, the data reception and transmission modules 6A and 6B constitute synchronization means connected to the processing unit 5 in order to assign to each measured magnetic field value a respective measuring instant correlated to an absolute time reference.

In light of this, in the instrument 1 of the invention, the sensors 3 are preferably coupled to at least one GPS 7 or other system suitable for providing an absolute time reference (it should be noted that two GPS or like systems might be used to interact with respective sensors).

Another advantage of the presence of the data reception and transmission modules 6A and 6B is that of avoiding direct connection of the processing unit 5 to both of the sensors 3.

In the example illustrated, only the first sensor 3A is connected directly to the processing unit 5. The second sensor 3B is nevertheless connected indirectly to the processing unit 5 through the data reception and transmission modules 6A and 6B.

Preferably, the instrument 1 comprises, for each of the sensors 3, a shell 8, forming a shield for the sensor 3.

More specifically, the shell 8 comprises a shielding layer (made for example of a μ-metal or other known alloy having similar properties; preferably of a material forming a superparamagnet) connectable to the apparatus 2 in the respective measuring section 4 in such a way as to encompass the respective portion of the apparatus 2 and the sensor 3 coupled to it, thus forming a magnetic shield for the sensor 3.

More specifically, the shielding layer is made of a low-reluctance material. Further, the shielding layer is made preferably of a soft material, that is, a material corresponding to a low-coercive magnetic field, that is, defining a hysteresis loop having a very small area.

This advantageously allows the instrument 1 to be made highly sensitive and immune to noise outside the apparatus 2.

The instrument 1 further comprises, for each of the sensors 3, at least a first spacing element 9, to be positioned between the apparatus 2 and the sensor 3 coupled to it. The spacing element 9 is designed to avoid excessive stress to the sensor 3 in order to prevent accidental faults in the event of voltage surges on the apparatus 2.

The instrument 1 also comprises a second spacing element 10, to be positioned between the sensor 3 and the shield (that is, the shell) 8 coupled to it.

It should be noted that the spacing elements are made of a magnetically inert material (for example a plastic material or Teflon).

Preferably, the shell 8, that is, the low-reluctance layer is designed to be applied to the apparatus 2 to form with the latter a closed volume containing the sensor 3.

Figure 4:
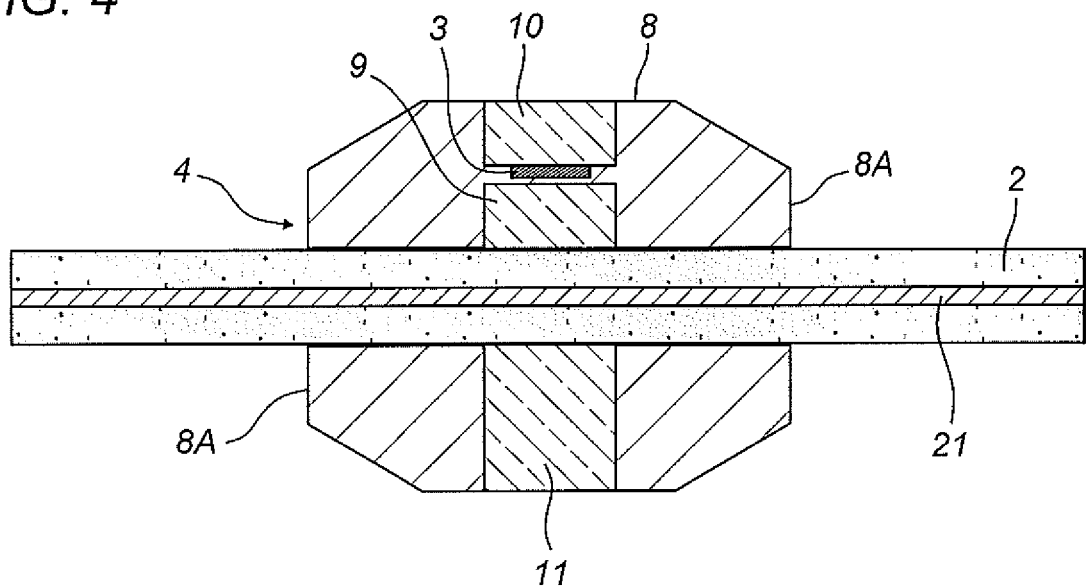
FIG. 4 shows the detail of FIG. 3 according to another embodiment.

For example, it is shaped like the wall of a cylinder. Preferably, the shell 8 also comprises side walls 8A (substantially annular in shape) adapted to axially close the volume formed inside the shell 8 (as illustrated by way of an example in FIG. 4).

This advantageously allows noise to be reduced in a particularly effective manner. In effect, the shielding layer forming a closed volume containing the sensor 3 forms a zero Gauss chamber.

Another advantage of the shell 8 forming a closed volume containing the sensor 3 is that it limits the value of the magnetic field in the region where the sensor 3 is located, thus making it possible to use very sensitive sensors without the risk of damaging or overstressing them.

In light of this, the invention contemplates the use of further spacing elements 11 interposed between the shell 8 and the cable 2 in the zones of the measuring section 4 where there is no sensor 3, so as to confer greater stability and strength to the structure constituted by the sensor and the shell 8 connected to it.

Preferably, the sensors 3A and 3B are mounted in the respective measuring sections 4 at corresponding angular positions (that is, at the same angular positions) relative to the apparatus 2.

Figure 5:
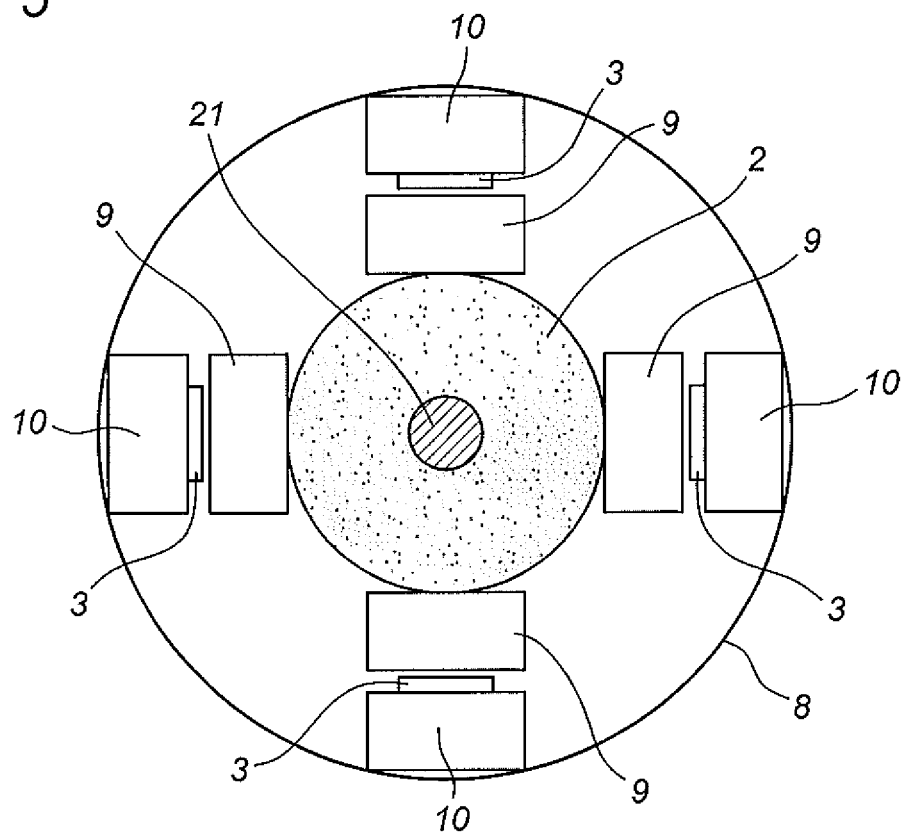
FIG. 5 shows the detail of FIG. 2 according to another embodiment.

In an alternative embodiment (illustrated in FIG. 5), the instrument 1 comprises a first and a second plurality of sensors 3A and 3B to be coupled to the apparatus 2 in the first and second measuring sections 4A and 4B, respectively.

The first and second pluralities of sensors 3 are designed to measure corresponding values of the magnetic field generated outside the apparatus 2 by the load current flowing axially through the apparatus 2.

The sensors of the first and second pluralities, respectively, are radially spaced to be fitted round the apparatus (preferably in angularly uniform manner).

For example, they are associated with an inside surface of the cylindrical shell 8 by means of the spacing elements 10 in such a way as to be distributed uniformly along the annular extension of that surface.

In light of this, the processing unit 5 is designed to receive the magnetic field values measured by the pluralities of sensors 3 and to obtain, for each plurality of values received, an averaged value to be used to derive the loss factor value.

This allows a highly robust and precise measurement.

Furthermore, the configuration with a plurality sensors 3 mounted in the same section 4 spaced along the annular periphery of the apparatus advantageously allows measurement of the position of the lead 21 relative to the sensors 3.

In light of this, the processing unit 5 is set up to calculate the position of the lead 21 relative to the sensors 3 as a function of the magnetic field values measured by the sensors, This makes it possible to take into account a possible incorrect positioning of the lead 21 inside the apparatus 2.

The invention also provides a method for measuring the loss factor (tan delta or tan δ) of an electrical apparatus 2 having axially extending elongate geometry. The apparatus 2 is an electrical cable.

According to the invention, the method comprises the following steps:
  coupling at least a first and a second sensor 3A and 3B to the apparatus 2 in a first and a second measuring section 4A and 4B axially spaced along the apparatus 2 by a known quantity, respectively;
  measuring, through the first and the second sensor 3A and 3B, respectively, a first and a second value of the magnetic field generated outside the apparatus 2 by a load current flowing axially through the apparatus 2;
  deriving a loss factor value as a function of the difference between the first and the second measured magnetic field value.

It should be noticed that, according to the invention, each of the sensors 3A and 3B measures a signal representing the value of the tangential magnetic field, that is, generated by the load current flowing axially through the apparatus 2.

The processing unit 5 is configured to perform a sampling of the signals for generating a digital representation of the signals.

Further, these magnetic field signals measured by the sensors are transformed into a Fourier series in order to obtain a representation of them in the frequency domain, Preferably, the loss factor value is derived by applying equation 1 described above in connection with the instrument 1.

The method also comprises a step of synchronizing the measurements taken by the first and the second sensor 3A and 3B in such a way as to assign to each measured magnetic field value a respective measuring instant correlated to an absolute time reference 7.

The invention has the following advantages.

The invention provides an instrument and a method for measuring in a highly reliable and precise manner the loss factor of an electrical apparatus having an axially extending elongate geometry.

Further, the invention allows tan delta to be measured on live electric cables (performing the measurements online without placing the cable out of service), without adversely affecting measuring efficiency or precision.

Moreover, the tan delta measurement obtained according to this invention is highly robust and precise since it is obtained by an effective integral processing of tan delta in a stretch of the apparatus of predetermined length (more specifically, the stretch between the two sensors 3A and 3B), instead of being a point measurement performed on a single section of the apparatus.

The invention claimed is:

1. An instrument (1) for measuring the loss factor of an electrical apparatus (2) having an axially extending elongate geometry, comprising:
   at least a first and a second sensor (3A, 3B) connectable to the apparatus (2) in a first and a second measuring section (4A, 4B) axially spaced along the apparatus (2) by a predetermined quantity, respectively, and designed to measure corresponding values of the magnetic field signals generated outside the apparatus (2) by a load current flowing axially through the apparatus at said first and second measuring sections (4A, 4B), said values being representative of the amplitude of said magnetic field signals;
   a processing unit (5) designed to receive said magnetic field values measured by the sensors (3A, 3B) and programmed to derive from them a load loss value as a function of the difference between said measured magnetic field values, said difference being representative of the difference between the amplitude of said magnetic field signals at said measuring sections (4A, 4B).

2. The instrument according to claim 1, wherein the processing unit (5) is programmed for deriving a Fourier transformation of said magnetic field signals measured at said first and second measuring sections (4A, 4B).

3. The instrument according to claim 2, wherein the processing unit (5) is programmed to derive a load loss value as a function of the difference between the measured magnetic field values, according to the following equation:

$$\frac{R}{d} \cdot \frac{Re(H_\tau(z_2, \omega) - H_\tau(z_1, \omega))}{\frac{\omega \cdot E}{c \cdot 2 \cdot \sqrt{2\pi}} \cdot \varepsilon_0 \cdot (z_2 - z_1)} = \frac{1}{(z_2 - z_1)} \cdot \int_{z_1}^{z_2} \tan\delta(z) dz$$

4. The instrument according to claim 1, wherein the processing unit (5) is programmed for deriving effective values or peak values of said magnetic field signals measured at said first and second measuring sections (4A, 4B).

5. The instrument according to claim 1, comprising synchronization means (6) connected to the processing unit (5) in order to assign to each measured magnetic field value a respective measuring instant correlated to an absolute time reference (7).

6. The instrument according to claim 1, comprising, for each of the sensors (3), a low-reluctance layer (8) that can be coupled to the apparatus (2) in the corresponding measuring section (4) in such a way as to encompass the respective portion of the apparatus (2) and the sensor (3) coupled to it, thus forming a magnetic shield for the sensor (3).

7. The instrument according to claim 6, comprising for each of the sensors (3A, 3B), at least a first spacing element (9), to be positioned between the apparatus (2) and the sensor (3) coupled to it, and a second spacing element (10), to be positioned between the sensor (3) and the shield (8) coupled to it.

8. The instrument according to claim 6, wherein the low-reluctance layer (8) is designed to be applied to the apparatus (2) to form with the latter a closed volume containing the sensor (3).

9. The instrument according to claim 1, comprising a first and a second plurality of sensors (3) to be coupled to the apparatus in the first and second measuring sections (4A, 4B), respectively, and designed to measure corresponding values of the magnetic field generated outside the apparatus (2) by the load current flowing axially through the apparatus (2), the sensors (3) of the first and the second plurality, respectively, being radially spaced to be fitted round the apparatus (2),
   the processing unit (5) being designed to receive the magnetic field values measured by the pluralities of sensors (3) and to obtain, for each plurality of values received, a derived value to be used to calculate the loss factor.

10. The instrument according to claim 1, comprising a first and a second plurality of sensors (3) to be coupled to the apparatus in the first and second measuring sections (4A, 4B), respectively, and designed to measure corresponding values of the magnetic field generated outside the apparatus (2) by the load current flowing axially through the apparatus (2), the sensors (3) of the first and the second plurality, respectively, being radially spaced to be fitted round the apparatus (2),
   the processing unit (5) being designed to receive the magnetic field values measured by the pluralities of sensors (3) and to obtain, for each plurality of values received, a position relative to the sensors (3) of a lead (21) through which the load current flows.

11. A method for measuring the loss factor of an electrical apparatus (2) having axially extending elongate geometry, comprising the following steps:
   coupling at least a first and a second sensor (3A, 3B) to the apparatus in a first and a second measuring section (4A, 4B) axially spaced along the apparatus (2) by a known quantity, respectively;
   measuring, through the first and the second sensor (3A, 3B), respectively, at least a first and a second value of the magnetic field signals generated outside the apparatus (2) by a load current flowing axially through the apparatus (2) at said first and second measuring section (4A, 4B), said values being representative of the amplitude of said magnetic field signals;
   deriving a loss factor value as a function of the difference between the first and the second measured magnetic field value, said difference being representative of the difference between the amplitude of said magnetic field signals at said first and second measuring section (4A, 4B).

12. The method according to claim 11, which comprises a step of deriving a Fourier transformation of the magnetic field signals measured at said first and second measuring sections (4A, 4B).

13. The method according to claim 12, wherein the loss factor value is derived by applying the following formula:

$$\frac{R}{d} \cdot \frac{Re(H_\tau(z_2, \omega) - H_\tau(z_1, \omega))}{\frac{\omega \cdot E}{c \cdot 2 \cdot \sqrt{2\pi}} \cdot \varepsilon_0 \cdot (z_2 - z_1)} = \frac{1}{(z_2 - z_1)} \cdot \int_{z_1}^{z_2} \tan\delta(z) dz$$

14. The method according to claim 11, wherein said magnetic field values are effective values or peak values of said magnetic field signals measured at said first and second measuring sections (4A, 4B).

15. The method according to claim 11, comprising a step of synchronizing the measurements taken by the first and the second sensor (3A, 3B) in such a way as to assign to each measured magnetic field value a respective measuring instant correlated to an absolute time reference (7).

* * * * *